(12) United States Patent
Yokoyama

(10) Patent No.: US 7,821,074 B2
(45) Date of Patent: Oct. 26, 2010

(54) SEMICONDUCTOR DEVICE AND METHOD FOR MANUFACTURING SAME

(75) Inventor: Takashi Yokoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/246,210

(22) Filed: Oct. 6, 2008

(65) Prior Publication Data

US 2009/0108367 A1    Apr. 30, 2009

(30) Foreign Application Priority Data

Oct. 24, 2007    (JP) .............................. 2007-275882

(51) Int. Cl.
*H01L 23/62*    (2006.01)
(52) U.S. Cl. ..................................... 257/369
(58) Field of Classification Search ................. 257/369, 257/59
See application file for complete search history.

(56) References Cited

U.S. PATENT DOCUMENTS

| | | | |
|---|---|---|---|
| 7,238,578 B2 * | 7/2007 | Burbach et al. ............. | 438/275 |
| 2007/0200179 A1 * | 8/2007 | Chen .......................... | 257/369 |
| 2008/0179638 A1 * | 7/2008 | Dyer et al. .................. | 257/288 |
| 2008/0303068 A1 * | 12/2008 | Grill et al. .................. | 257/288 |

OTHER PUBLICATIONS

Yang et al., "Dual Streee Liner for High Performance sub-45nm Gate Lenght SOI CMOS Manufacturing", IEDM Tech. Dig., pp. 1075, 2004.

Yun et al. "Abnormal Oxidation of Formed on Arsenic Doped Substrate", Electrochemical and Solid-State Letters, 7 (4) G83-G85, (2004).

* cited by examiner

*Primary Examiner*—Nathan W Ha
(74) *Attorney, Agent, or Firm*—Robert J. Depke; Rockey, Depke & Lyons, LLC

(57) ABSTRACT

The present invention provides a semiconductor device includes: an element isolation region configured to be formed in a semiconductor substrate; a P-type field effect transistor configured to be formed in a first element formation region of the semiconductor substrate for which isolation by the element isolation region is carried out; an N-type substrate region configured to be formed in the semiconductor substrate for which isolation by the element isolation region is carried out, arsenic being ion-implanted into the N-type substrate region; a nickel silicide layer configured to be formed on the N-type substrate region; a first insulating film configured to cover the P-type field effect transistor and have compressive stress; and a second insulating film configured to cover the N-type substrate region and have tensile stress or compressive stress lower than the compressive stress of the first insulating film.

8 Claims, 18 Drawing Sheets

BOUNDARY BETWEEN
PFET AND NFET

SEMICONDUCTOR DEVICE AND METHOD FOR MANUFACTURING SAME

CROSS REFERENCES TO RELATED APPLICATIONS

The present invention contains subject matter related to Japanese Patent Application JP 2007-275882, filed in the Japan Patent Office on Oct. 24, 2007, the entire contents of which being incorporated herein by reference.

BACKGROUND OF THE INVENTION

1. Field of the Invention

The present invention relates to a semiconductor device and a method for manufacturing the same.

2. Description of Related Art

In order to enhance the performance of semiconductor LSI devices, traditionally, the design scale is decreased to 0.7 times that of the previous-generation devices based on the Moore's scaling law, to thereby attempt improvement regarding the circuit processing speed, the power consumption, and so on. However, for LSI devices of the 45-nm-generation and the subsequent generations, it is becoming impossible to achieve enhanced performance through mere size shrinking, due to the influence of the abrupt deterioration of the short-channel characteristic of MOSFETs, and so on. To address this problem, as a technique to achieve enhanced performance, a technique of applying strain to a gate to thereby enhance the current of the transistor is being actively researched and developed. As one of methods for this technique, there has been developed a dual stress liner (DSL) technique in which stress is applied to a gate from a contact etch stop layer (CESL) film and the stress value is varied for each of an NMOS transistor region and a PMOS transistor region to thereby allow each of the transistors to achieve the preferred performance (refer to e.g. H. -S. Yang et al., "Dual Stress Liner for High Performance sub-45 nm Gate Length SOI CMOS Manufacturing" IEDM Tech. Dig., p. 1075, 2004).

In many cases, ion implantation of arsenic (As) is performed for the deep source and drain of the NMOS field effect transistor (hereinafter, referred to as NFET), and the same ion implantation is performed also for an N-type substrate region that is formed simultaneously. However, if ion implantation of arsenic (As) is performed and a nickel silicide layer is formed, an abnormal oxide film will be formed on this nickel silicide layer (refer to e.g. Jung-Gn Yun et al., "Abnormal Oxidation of Formed on Arsenic-Doped Substrate" Electrochemical and Solid-State Letters, 7 (4) G83-G85 (2004)), and water and so on will be absorbed by this abnormal film. This will significantly deteriorate the adhesion between the nickel silicide layer and a silicon nitride film as the CESL film. In particular, the following problem will occur if, as shown in FIG. 18, a dense film like a silicon nitride film 241 having compressive stress is applied. Specifically, water will be hardly discharged from an abnormal oxide film (not shown) on the surface of a nickel silicide layer 229 of the case in which ion implantation of arsenic (As) is performed, and thus separation at the interface between the nickel silicide 229 and the silicon nitride film 241 will occur. This problem applies to an N-type substrate region 214 of the case in which a dual stress liner film is applied.

Another problem will also occur if, as shown in FIG. 19A, a compressive silicon nitride film is applied in order to enhance the mobility of a P-type field effect transistor 202 (hereinafter, referred to as PFET). Specifically, compressive stress, which is unfavorable for the PFET, will be applied along the direction of the gate width of a gate electrode 222 (W direction). Thus, although stress is applied along the direction of the gate length of the gate electrode 222 (L direction) by applying the compressive film, the effect of this stress application cannot be brought out to the full. Ideally, it is desired that, as shown in FIG. 19B, tensile stress be applied along the direction of the gate width of the gate electrode 222 (W direction) and compressive stress be applied along the direction of the gate length of the gate electrode 222 (L direction).

Consequently, the problem that should be solved is that, if a dense film such as a compressive film is applied as a silicon nitride film, water absorbed by an abnormal oxide film formed on a nickel silicide layer is hardly discharged and thus separation occurs at the interface between the nickel silicide layer and the silicon nitride film.

SUMMARY OF THE INVENTION

There is a need for the present invention to allow prevention of film separation by defining the stress of an insulating film on a nickel silicide layer.

According to an embodiment of the present invention, there is provided a semiconductor device including an element isolation region configured to be formed in a semiconductor substrate, a P-type field effect transistor configured to be formed in a first element formation region of the semiconductor substrate for which isolation by the element isolation region is carried out, and an N-type substrate region configured to be formed in the semiconductor substrate for which isolation by the element isolation region is carried out. Arsenic is ion-implanted into the N-type substrate region. The semiconductor device further includes a nickel silicide layer configured to be formed on the N-type substrate region, a first insulating film configured to cover the P-type field effect transistor and have compressive stress, and a second insulating film configured to cover the N-type substrate region and have tensile stress or compressive stress lower than the compressive stress of the first insulating film.

In the semiconductor device according to this embodiment of the present invention, the N-type substrate region is covered by the second insulating film having tensile stress or compressive stress lower than that of the first insulating film covering the P-type field effect transistor. Therefore, although the density of the first insulating film is high, the density of the second insulating film is lower than that of the first insulating film. In particular, the density of the second insulating film having tensile stress is low. Therefore, even when an abnormal film (e.g. a film containing oxygen) is formed on the nickel silicide layer formed on the N-type substrate region in which arsenic is ion-implanted and water is absorbed by this abnormal film, the absorbed water will be discharged to the external via the second insulating film.

According to another embodiment of the present invention, there is provided a method for manufacturing a semiconductor device. The method includes the steps of forming in a semiconductor substrate an element isolation region that isolates a first element formation region, an N-type substrate region, a second element formation region, and a P-type substrate region from each other, turning a partial portion of the semiconductor substrate in the first element formation region and the N-type substrate region into an N-type region and turning a partial portion of the semiconductor substrate in the second element formation region and the P-type substrate region into a P-type region, and forming a P-type field effect transistor in the first element formation region and forming an N-type field effect transistor in the second element formation region. The method further includes the steps of forming a nickel silicide layer on the N-type substrate region after ion implantation of arsenic into the N-type substrate region, forming a first insulating film that covers the P-type field effect transistor and has compressive stress over the semiconductor substrate except the N-type substrate region, and forming a second insulating film that covers the N-type substrate region and has tensile stress or compressive stress lower than the compressive stress of the first insulating film.

In the method for manufacturing a semiconductor device according to this embodiment of the present invention, the N-type substrate region is covered by the second insulating film having tensile stress or compressive stress lower than that of the first insulating film covering the P-type field effect transistor. Therefore, although the density of the first insulating film is high, the density of the second insulating film is lower than that of the first insulating film. In particular, the density of the second insulating film having tensile stress is low. Therefore, even when an abnormal film (e.g. a film containing oxygen) is formed on the nickel silicide layer formed on the N-type substrate region in which arsenic is ion-implanted and water is absorbed by this abnormal film, the absorbed water will be discharged to the external via the second insulating film.

The semiconductor device according to the embodiment of the present invention allows water absorbed on the nickel silicide layer to be discharged to the external via the second insulating film, and thus has an advantage that the problem of film separation on the nickel silicide layer on the N-type substrate region can be solved.

The method for manufacturing a semiconductor device according to the embodiment of the present invention allows water absorbed on the nickel silicide layer to be discharged to the external via the second insulating film, and thus has an advantage that the problem of film separation on the nickel silicide layer on the N-type substrate region can be solved.

DETAILED DESCRIPTION OF THE PREFERRED EMBODIMENTS

A semiconductor device according to one embodiment (first embodiment) of the present invention will be described below with reference to a layout plane view of FIG. 1.

Figure 1:
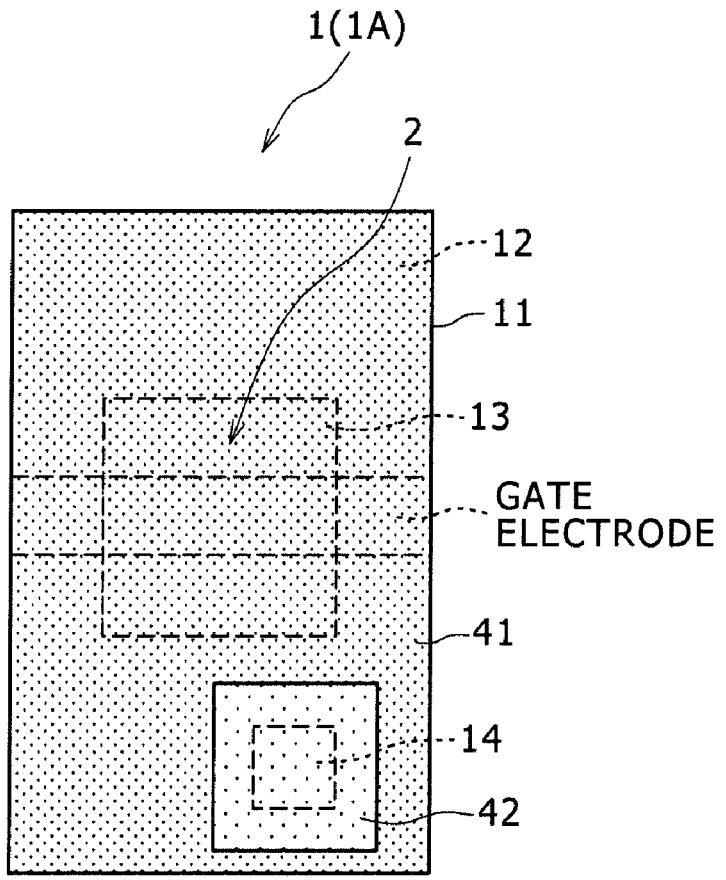
FIG. 1 is a layout plan view showing a semiconductor device according to one embodiment (first embodiment) of the present invention.

As shown in FIG. 1, by an element isolation region 12 formed in a semiconductor substrate 11, a first element formation region 13 as the formation region of a P-type field effect transistor 2 and an N-type substrate region 14 serving as a contact region are isolate from each other.

The P-type field effect transistor 2 is formed in the first element formation region 13. In the N-type substrate region 14, arsenic is ion-implanted to a deep position (e.g. to a position deeper than the source and drain regions of the transistor). On this N-type substrate region 14, a nickel silicide layer (not shown) is formed e.g. across the entire surface of the N-type substrate region 14. By this ion implantation, an N-type region is formed in the N-type substrate region 14.

Furthermore, over the P-type field effect transistor 2, a first insulating film 41 that covers the transistor 2 and has compressive stress is formed. This first insulating film 41 is formed of e.g. a silicon nitride (SiN) film having compressive stress. Over the N-type substrate region 14, a second insulating film 42 that has tensile stress or compressive stress lower than the compressive stress of the first insulating film 41 is formed. This second insulating film 42 is formed of e.g. a silicon nitride (SiN) film having tensile stress or a silicon nitride (SiN) film having compressive stress lower than that of the first insulating film 41. It is also possible to form this second insulating film by using, instead of a silicon nitride film, a silicon oxide (SiO) film, a silicon oxycarbide (SiOC) film, or the like having the above-described characteristic.

In general, if the internal stress of the insulating film itself, such as a silicon nitride film, silicon oxide film, or silicon oxycarbide film, is tensile stress, the density of this film is low. If the internal stress of the insulating film itself, such as a silicon nitride film, silicon oxide film, or silicon oxycarbide film, is compressive stress, the density of this film is high. The higher the stress is, the stronger the tendency toward higher density or lower density is. Embodiments of the present invention are made by utilizing this phenomenon.

In this semiconductor device 1 (1A), the N-type substrate region 14 is covered by the second insulating film 42 having tensile stress or compressive stress lower than that of the first insulating film 41 covering the P-type field effect transistor 2. Therefore, although the density of the first insulating film 41 is high, the density of the second insulating film 42 is lower than that of the first insulating film 41. In particular, the density of the second insulating film 42 having tensile stress is low. Therefore, even when an abnormal film (e.g. a film containing oxygen) is formed on the nickel silicide layer formed on the N-type substrate region 14 in which arsenic is ion-implanted to a deep position and water is absorbed by this abnormal film, the absorbed water will be discharged to the external via the second insulating film 42. Thus, the problem of film separation can be solved.

Figure 2:
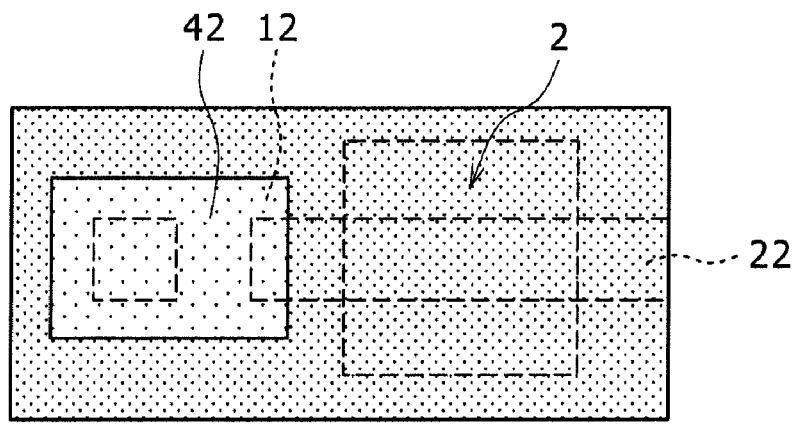
FIG. 2 is a layout plan view showing a modification example of the first embodiment.

Furthermore, as shown in FIG. 2, the second insulating film 42 having tensile stress may be so formed as to overlap with an end of a gate electrode 22 of the P-type field effect transistor 2 over the element isolation region 12. Moreover, although not shown in a diagram, the second insulating film 42 having tensile stress may be formed in proximity to the first element formation region 13 on an end side of the gate electrode 22 of the P-type field effect transistor 2 over the element isolation region 12.

In the structure shown in FIG. 2, the second insulating film 42 having tensile stress is so formed as to overlap with an end of the gate electrode 22 of the P-type field effect transistor 2. Thus, the tensile stress is applied to the gate electrode 22 of the P-type field effect transistor 2, which further enhances the on-current (Ion).

A semiconductor device according to one embodiment (second embodiment) of the present invention will be described below with reference to a layout plane view of FIG. 3.

Figure 3:
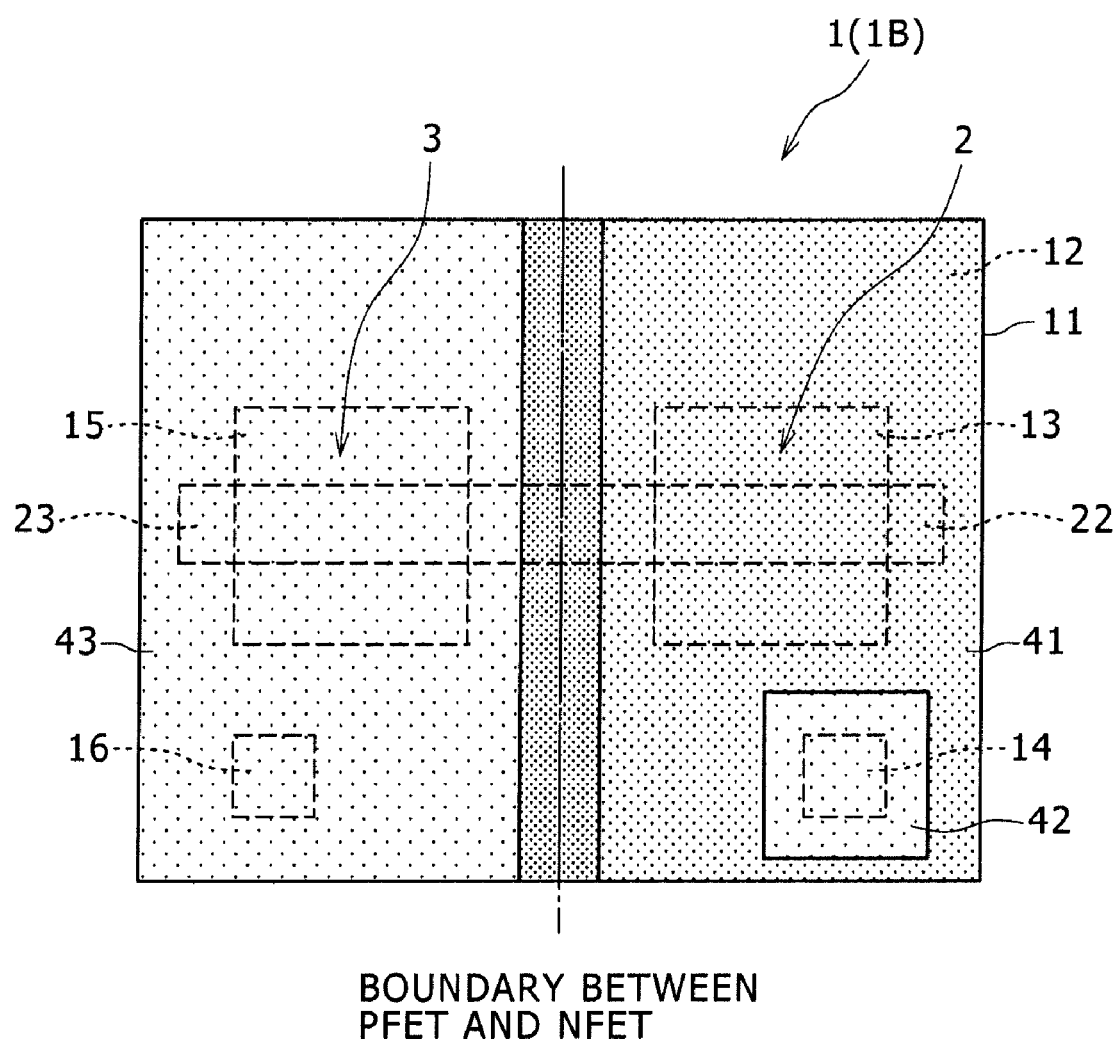
FIG. 3 is a layout plan view showing a semiconductor device according to one embodiment (second embodiment) of the present invention.

As shown in FIG. 3, by an element isolation region 12 formed in a semiconductor substrate 11, a first element formation region 13 as the formation region of a P-type field effect transistor 2, an N-type substrate region 14 serving as a contact region, a second element formation region 15 as the formation region of an N-type field effect transistor 3, and a P-type substrate region 16 serving as a contact region are isolate from each other.

The P-type field effect transistor 2 is formed in the first element formation region 13. In the N-type substrate region 14, arsenic is ion-implanted to a deep position (e.g. to a position deeper than the source and drain regions of the transistor). On this N-type substrate region 14, a nickel silicide layer (not shown) is formed e.g. across the entire surface of the N-type substrate region 14. By this ion implantation, an N-type region is formed in the N-type substrate region 14.

The N-type field effect transistor 3 is formed in the second element formation region 15. A gate electrode 23 of the N-type field effect transistor 3 is formed continuously with a gate electrode 22 of the P-type field effect transistor 2. On the P-type substrate region 16, a nickel silicide layer (not shown) is formed e.g. across the entire surface of the P-type substrate region 16.

Furthermore, over the P-type field effect transistor 2, a first insulating film 41 that covers the transistor 2 and has compressive stress is formed. This first insulating film 41 is formed of e.g. a silicon nitride (SiN) film having compressive stress. Over the N-type substrate region 14, a second insulating film 42 that has tensile stress or compressive stress lower than the compressive stress of the first insulating film 41 is formed. This second insulating film 42 is formed of e.g. a silicon nitride (SiN) film having tensile stress or a silicon nitride (SiN) film having compressive stress lower than that of the first insulating film 41. It is also possible to form this second insulating film by using, instead of a silicon nitride film, a silicon oxide (SiO) film, a silicon oxycarbide (SiOC) film, or the like having the above-described characteristic. The "SiN" refers to a compound of Si and N, the "SiO" refers to a compound of Si and O, and the "SiOC" refers to a compound of Si, O, and C. These "SiN," "SiO," and "SiOC" will not limit the composition ratios of the compounds. This applies also to the following description.

Over the N-type field effect transistor 3 and the P-type substrate region 16, a third insulating film 43 that covers the transistor 3 and the region 16 and has tensile stress is formed. This third insulating film 43 is formed of e.g. a silicon nitride film having tensile stress.

In this semiconductor device 1 (1B), the N-type substrate region 14 is covered by the second insulating film 42 having tensile stress or compressive stress lower than that of the first insulating film 41 covering the P-type field effect transistor 2. Therefore, although the density of the first insulating film 41 is high, the density of the second insulating film 42 is lower than that of the first insulating film 41. In particular, the density of the second insulating film 42 having tensile stress is low. Therefore, even when an abnormal film (e.g. a film containing oxygen) is formed on the nickel silicide layer formed on the N-type substrate region 14 in which arsenic is ion-implanted to a deep position and water is absorbed by this abnormal film, the absorbed water will be discharged to the external via the second insulating film 42. Thus, the problem of film separation can be solved.

In the semiconductor device 1 (1B), the P-type field effect transistor 2 is covered by the first insulating film 41 having compressive stress, and the third insulating film 43 having tensile stress is so formed as to overlap with an end of the gate electrode 22 of the P-type field effect transistor 2. Thus, the tensile stress is applied to the gate electrode 22 of the P-type field effect transistor 2, which enhances the on-current (Ion).

Figure 4:
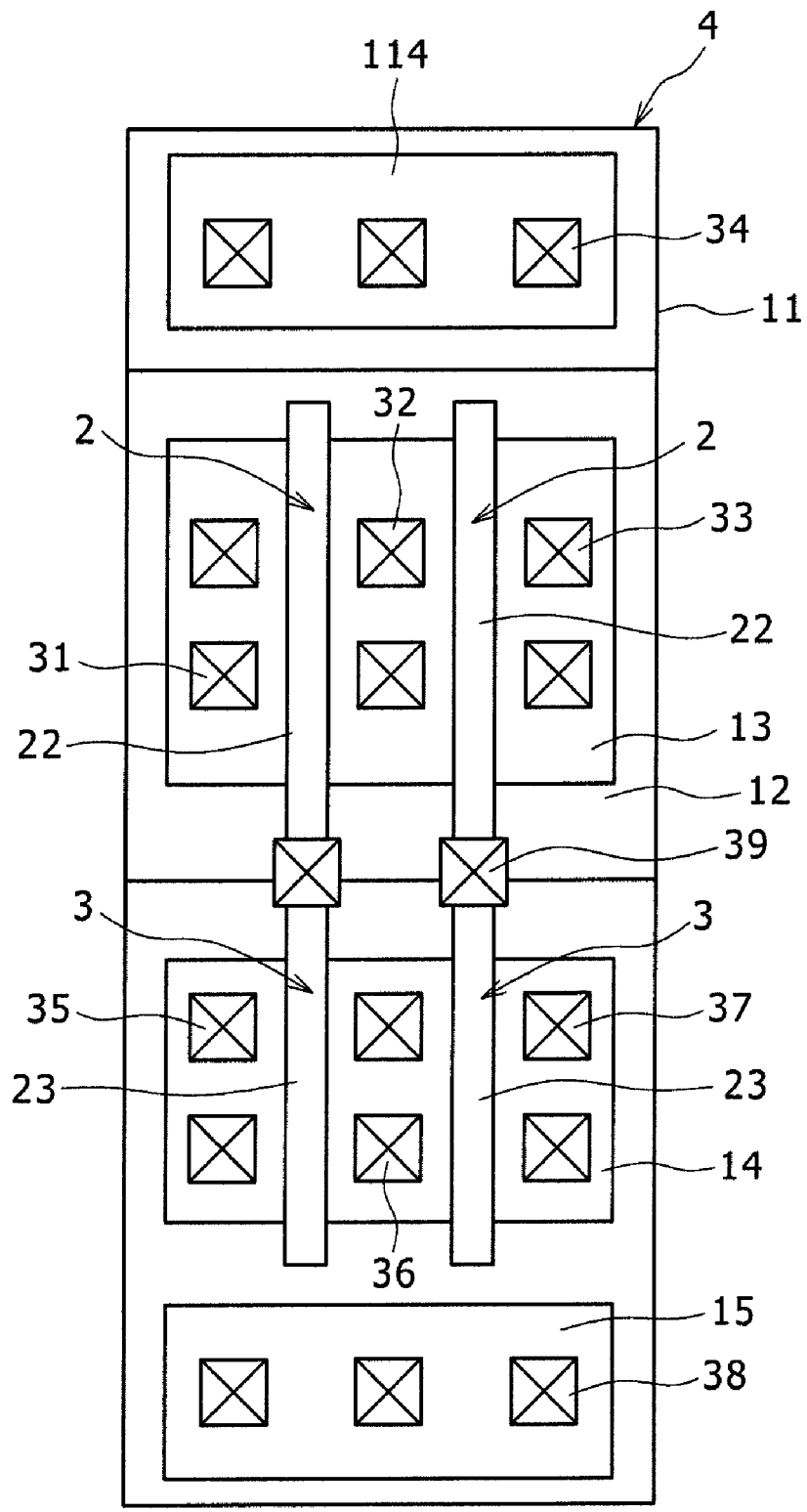
FIG. 4 is a layout plan view showing a semiconductor device according to one embodiment (third embodiment) of the present invention.
Figure 5:
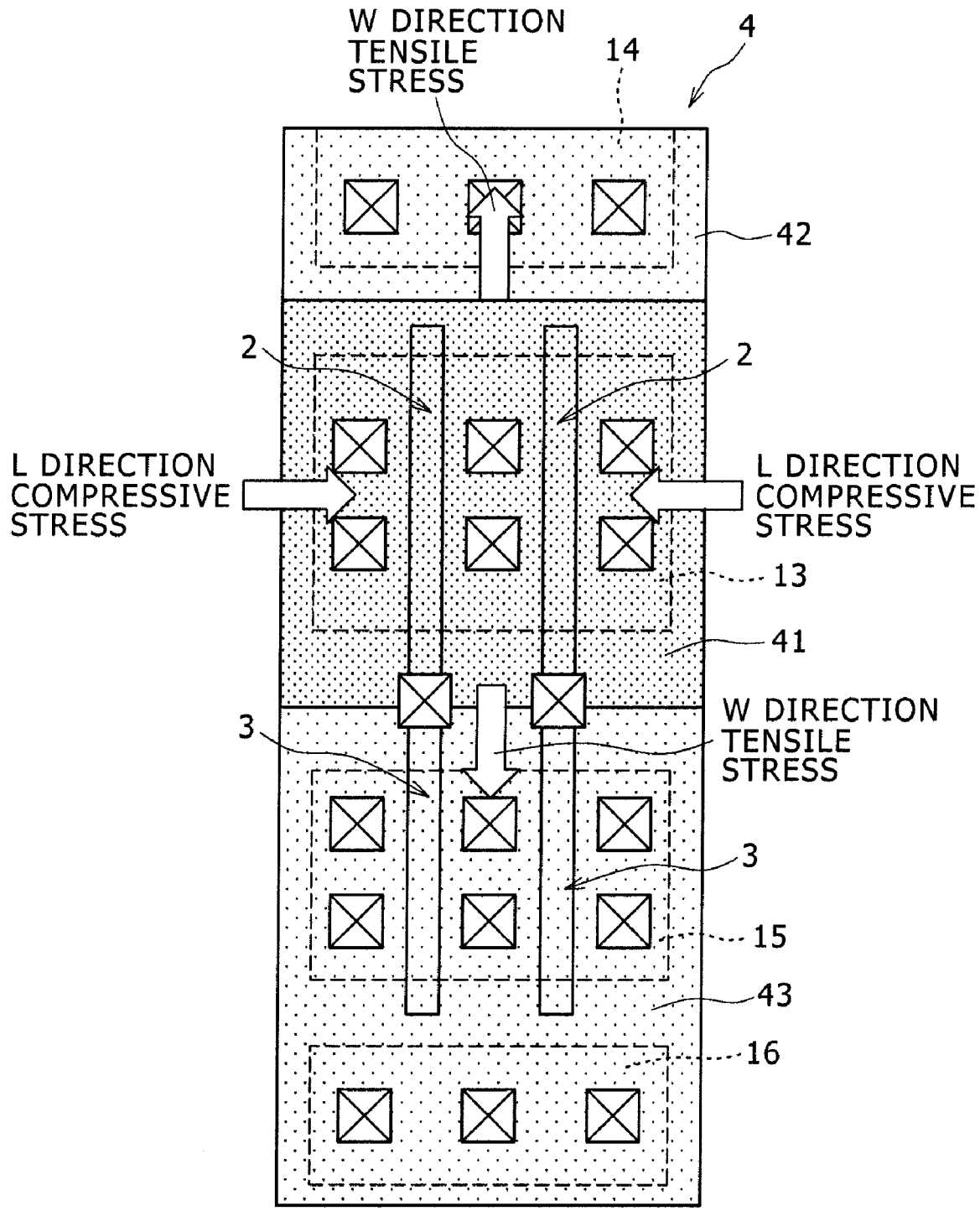
FIG. 5 is a layout plan view showing the semiconductor device according to one embodiment (third embodiment) of the present invention.

A semiconductor device according to one embodiment (third embodiment) of the present invention will be described below with reference to layout plane views of FIGS. 4 and 5. FIGS. 4 and 5 show one example of application to a semiconductor device that serves as a NAND circuit.

As shown in FIG. 4, by an element isolation region 12 formed in a semiconductor substrate 11, a first element formation region 13 as the formation region of a P-type field effect transistor 2, an N-type substrate region 14 serving as a contact region, a second element formation region 15 as the formation region of an N-type field effect transistor 3, and a P-type substrate region 16 serving as a contact region are isolate from each other.

In the first element formation region 13, two P-type field effect transistors 2 are formed as one example. In the regions of the respective sources and drains in the first element formation region 13, e.g. plural contacts 31, contacts 32, and contacts 33 are formed (in this example, two of each of the contacts 31, 32, and 33 are formed as one example).

In the N-type substrate region 14, arsenic is ion-implanted to a deep position (e.g. to a position deeper than the source and drain regions of the transistors). On this N-type substrate region 14, a nickel silicide layer (not shown) is formed e.g. across the entire surface of the N-type substrate region 14. By this ion implantation, an N-type region is formed in the N-type substrate region 14. Furthermore, e.g. plural contacts 34 are formed (in this example, three contacts 34 are formed as one example).

In the second element formation region 15, two N-type field effect transistors 3 are formed as one example. Gate electrodes 23 of the N-type field effect transistors 3 are formed continuously with gate electrodes 22 of the P-type field effect transistors 2. In the regions of the respective sources and drains in the second element formation region 15, e.g. plural contacts 35, contacts 36, and contacts 37 are formed (in this example, two of each of the contacts 35, 36, and 37 are formed as one example).

On the P-type substrate region 16, a nickel silicide layer (not shown) is formed e.g. across the entire surface of the P-type substrate region 16. Furthermore, e.g. plural contacts 38 are formed (in this example, three contacts 38 are formed as one example).

In addition, common contacts 39 are formed for the respective gate electrodes 22 and 23.

As shown in FIG. 5, in this semiconductor device 4 having the above-described configuration, over the respective P-type field effect transistors 2, a first insulating film 41 that covers the transistors 2 and has compressive stress is formed. This first insulating film 41 is formed of e.g. a silicon nitride (SiN) film having compressive stress. Over the N-type substrate region 14, a second insulating film 42 that has tensile stress or compressive stress lower than the compressive stress of the first insulating film 41 is formed. This second insulating film 42 is formed of e.g. a silicon nitride (SiN) film having tensile stress or a silicon nitride (SiN) film having compressive stress lower than that of the first insulating film 41. It is also possible to form this second insulating film by using, instead of a silicon nitride film, a silicon oxide (SiO) film, a silicon oxycarbide (SiOC) film, or the like having the above-described characteristic.

Furthermore, over the N-type field effect transistors 3 and the P-type substrate region 16, a third insulating film 43 that covers the transistors 3 and the region 16 and has tensile stress is formed. This third insulating film 43 is formed of e.g. a silicon nitride film having tensile stress.

In the semiconductor device 4, the N-type substrate region 14 is covered by the second insulating film 42 having tensile stress or compressive stress lower than that of the first insulating film 41 covering the P-type field effect transistors 2. Therefore, although the density of the first insulating film 41 is high, the density of the second insulating film 42 is lower than that of the first insulating film 41. In particular, the density of the second insulating film 42 having tensile stress is low. Therefore, even when an abnormal film (e.g. a film containing oxygen) is formed on the nickel silicide layer formed on the N-type substrate region 14 in which arsenic is ion-implanted to a deep position and water is absorbed by this abnormal film, the absorbed water will be discharged to the external via the second insulating film 42. Thus, the problem of film separation can be solved.

In the semiconductor device 4, the P-type field effect transistors 2 are covered by the first insulating film 41 having compressive stress, and the third insulating film 43 having tensile stress is so formed as to overlap with ends of the gate electrodes 22 of the P-type field effect transistors 2. Thus, the tensile stress is applied to the gate electrodes 22 of the P-type field effect transistors 2, which enhances the on-current (Ion).

A detailed description will be made below. Due to the formation of the second insulating film 42 having tensile stress over the N-type substrate region 14, the tensile stress is applied from the N-type substrate region 14 along the direction of the gate width of the P-type field effect transistors 2 (W direction). In addition, the tensile stress by the third insulating film 43 is similarly applied also from the N-type field effect transistor 3 side, and thus the stress applied along the direction of the gate width of the gate electrodes 22 of the P-type field effect transistors 2 has an ideal stress configuration. Furthermore, the compressive stress by the first insulating film 41 is applied along the gate-length direction (L direction). This compressive stress in addition to the tensile stress applied along the gate-width direction forms an ideal stress configuration to enhance the on-current. In addition, the proximity of the second insulating film 42 and the third insulating film 43 to the first element formation region 13 as the formation region of the P-type field effect transistors 2 is limited to such an extent that the second insulating film 42 and the third insulating film 43 are just in contact with the first element formation region 13. This makes it possible to make the most of the tensile stresses by the second insulating film 42 and the third insulating film 43. On the other hand, the P-type substrate region 16 is free from the problem of film separation, and it is preferable that the stress along the W direction of the N-type field effect transistors 3 be also tensile stress. Therefore, it is desirable to form the third insulating film 43 having tensile stress across the entire surface over the second element formation region 15. This can achieve an ideal dual stress liner (DSL) structure.

A comparative example of the semiconductor device 4 will be described below with reference to a layout plan view of FIG. 6.

Figure 6:
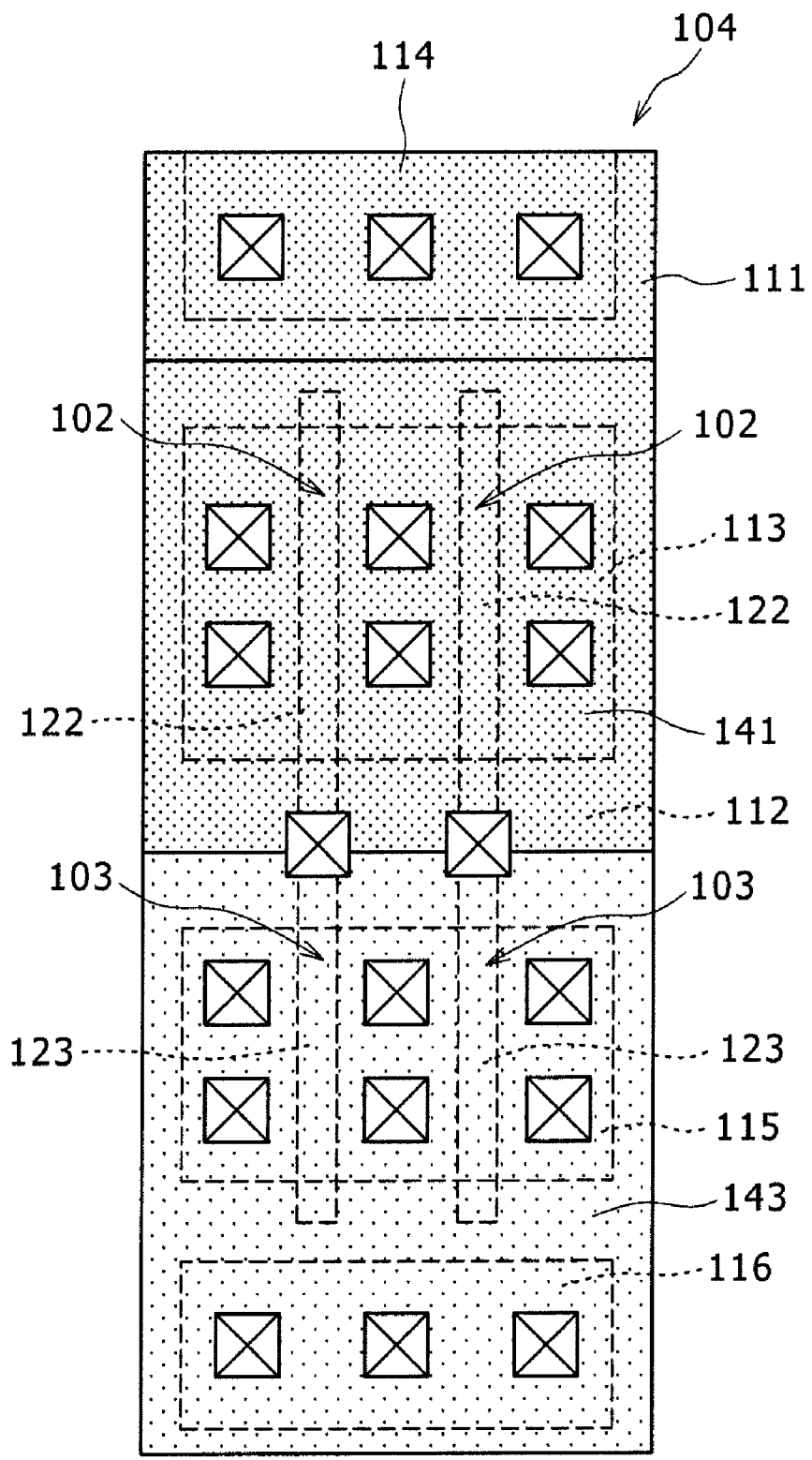
FIG. 6 is a layout plan view showing a comparative example.

As shown in FIG. 6, by an element isolation region 112 formed in a semiconductor substrate 111, a first element formation region 113 as the formation region of a P-type field effect transistor 102, an N-type substrate region 114 serving as a contact region, a second element formation region 115 as the formation region of an N-type field effect transistor 103, and a P-type substrate region 116 serving as a contact region are isolate from each other.

In the first element formation region 113, two P-type field effect transistors 102 are formed as one example. In the N-type substrate region 114, arsenic is ion-implanted to a deep position (e.g. to a position deeper than the source and drain regions of the transistor). On this N-type substrate region 114, a nickel silicide layer (not shown) is formed e.g. across the entire surface of the N-type substrate region 114. By this ion implantation, an N-type region is formed in the N-type substrate region 114.

In the second element formation region 115, two N-type field effect transistors 103 are formed as one example. Gate electrodes 123 of the N-type field effect transistors 103 are formed continuously with gate electrodes 122 of the P-type field effect transistors 102. On the P-type substrate region 116, a nickel silicide layer (not shown) is formed e.g. across the entire surface of the P-type substrate region 116.

In this semiconductor device 104 having the above-described configuration, over the respective P-type field effect transistors 102 and the N-type substrate region 114, a first insulating film 141 that covers the transistors 102 and the region 114 and has compressive stress is formed. This first insulating film 141 is formed of e.g. a silicon nitride film having compressive stress.

Furthermore, over the N-type field effect transistors 103 and the P-type substrate region 116, a third insulating film 143 that covers the transistors 103 and the region 116 and has tensile stress is formed. This third insulating film 143 is formed of e.g. a silicon nitride film having tensile stress.

In the semiconductor device 104, the N-type substrate region 114 is covered by the first insulating film 141 having compressive stress, and thus the first insulating film 141 is formed of a film with high density. Therefore, if an abnormal film (e.g. a film containing oxygen) is formed on the nickel silicide layer formed on the N-type substrate region 114 in which arsenic is ion-implanted to a deep position and water is absorbed by this abnormal film, the absorbed water will not be discharged to the external via the first insulating film 141. Thus, the problem of film separation will occur.

Figure 7:
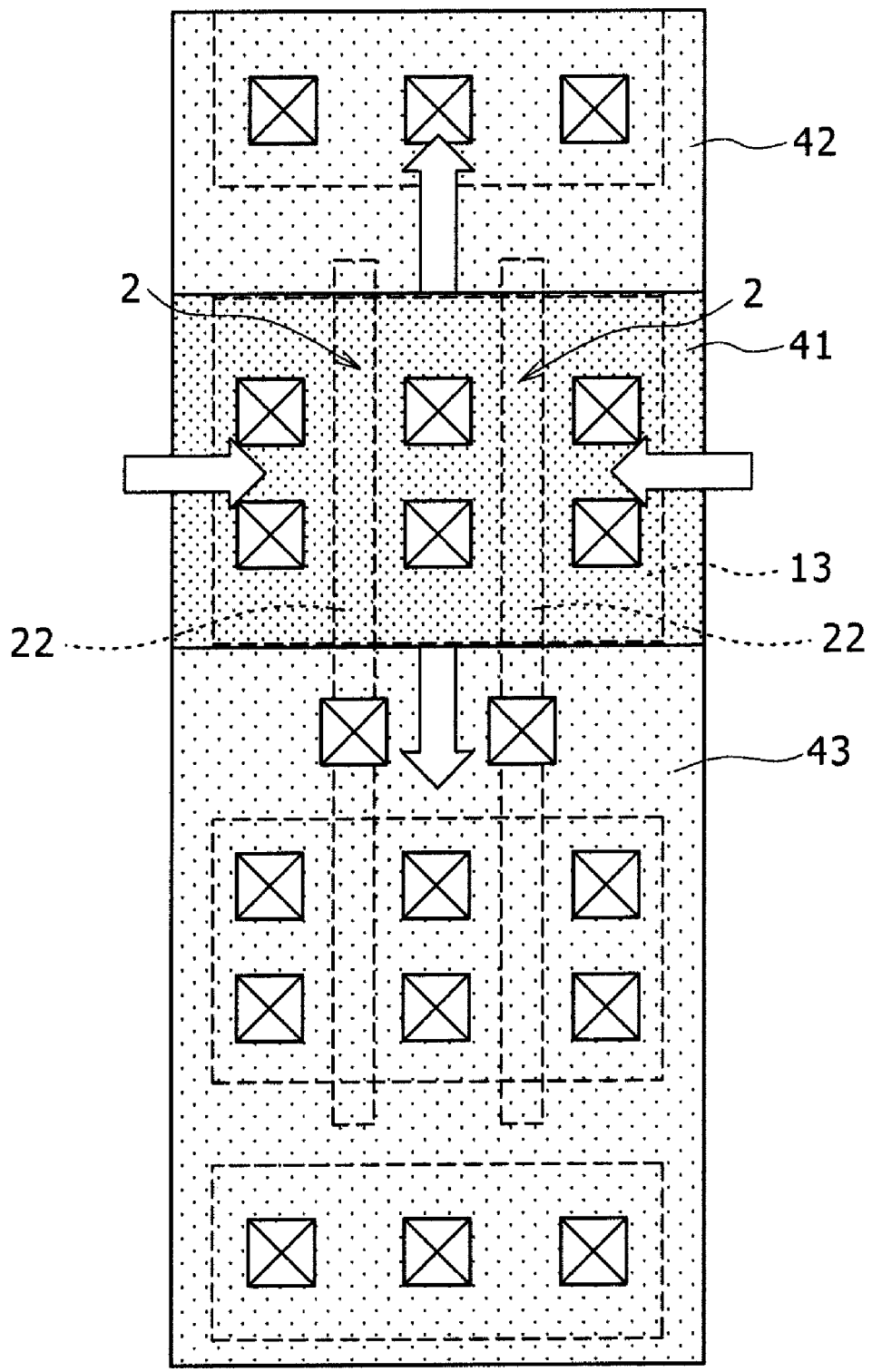
FIG. 7 is a layout plan view showing a modification example of the third embodiment.

A modification example of the third embodiment will be described below with reference to a layout plan view of FIG. 7. FIG. 7 shows one example of application to a semiconductor device that serves as a NAND circuit.

As shown in FIG. 7, it is preferable that the second insulating film 42 be formed in proximity to the first element formation region 13, in which the P-type field effect transistors 2 are formed. In this case, the second insulating film 42 may be formed in contact with the first element formation region 13. However, it is not preferable that the second insulating film 42 be so formed as to overlap with the first element formation region 13. Forming the second insulating film 42 in proximity to or in contact with the first element formation region 13 allows the tensile stress by the second insulating film 42 to act on the gate electrodes 22 of the P-type field effect transistors 2 to thereby enhance the on-current. In particular, forming the second insulating film 42 overlapping with the gate electrodes 22 facilitates the acting of the tensile stress by the second insulating film 42 on the gate electrodes 22.

Furthermore, it is preferable that the third insulating film 43 be formed in proximity to the first element formation region 13, in which the P-type field effect transistors 2 are formed. In this case, the third insulating film 43 may be formed in contact with the first element formation region 13. However, it is not preferable that the third insulating film 43 be so formed as to overlap with the first element formation region 13. Forming the third insulating film 43 in proximity to or in contact with the first element formation region 13 allows the tensile stress by the third insulating film 43 to act on the gate electrodes 22 of the P-type field effect transistors 2 to thereby enhance the on-current.

In the formation of the second insulating film 42 and the third insulating film 43 in proximity to or in contact with the first element formation region 13, it is preferable that these films be so formed that the upper surface of the first insulating film 41 is flush with the upper surfaces of the second insulating film 42 and the third insulating film 43.

Figure 8:
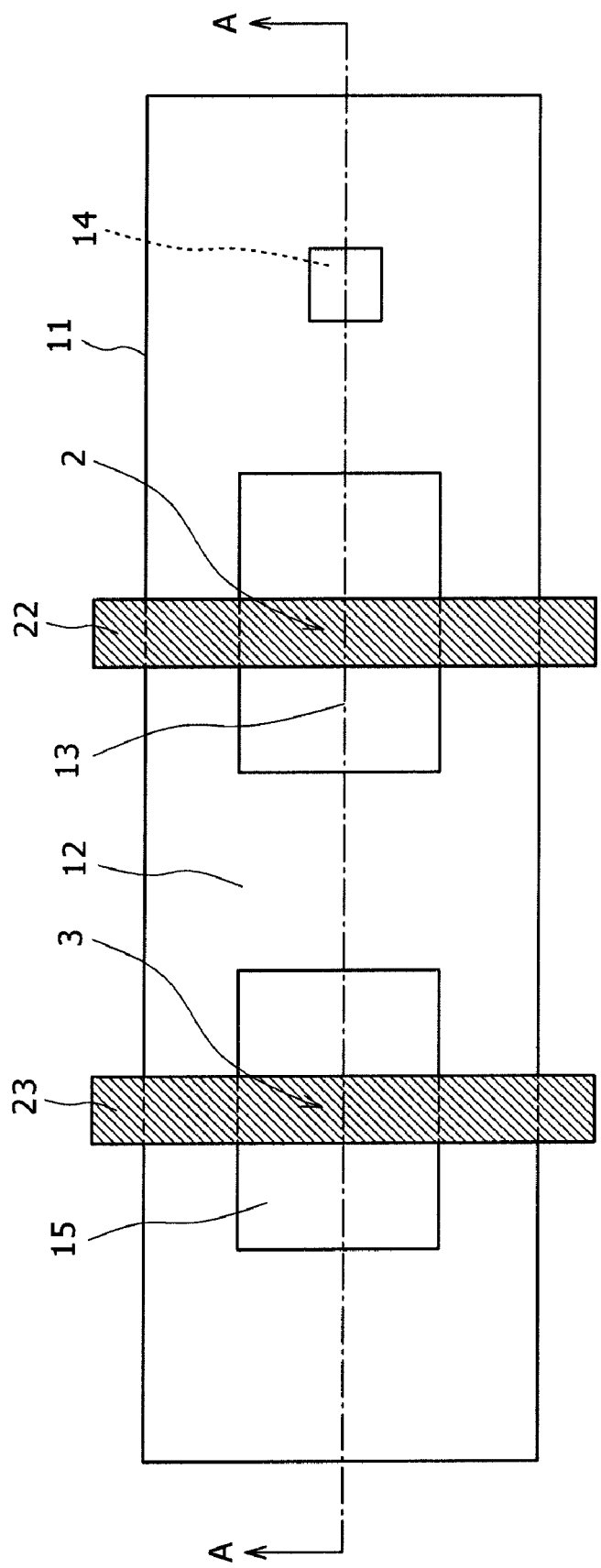
FIG. 8 is a layout plan view showing major part relating to a method for manufacturing a semiconductor device according to one embodiment of the present invention.

A method for manufacturing a semiconductor device according to one embodiment of the present invention will be described below with reference to a plan view of FIG. 8 showing the major-part layout and sectional views of FIGS. 9 to 17 showing manufacturing steps. The sections of FIGS. 9 to 17 are at the same position as that of the section along line AA in FIG. 8. FIG. 8 shows only major components of the respective components shown in FIG. 9.

Figure 9:
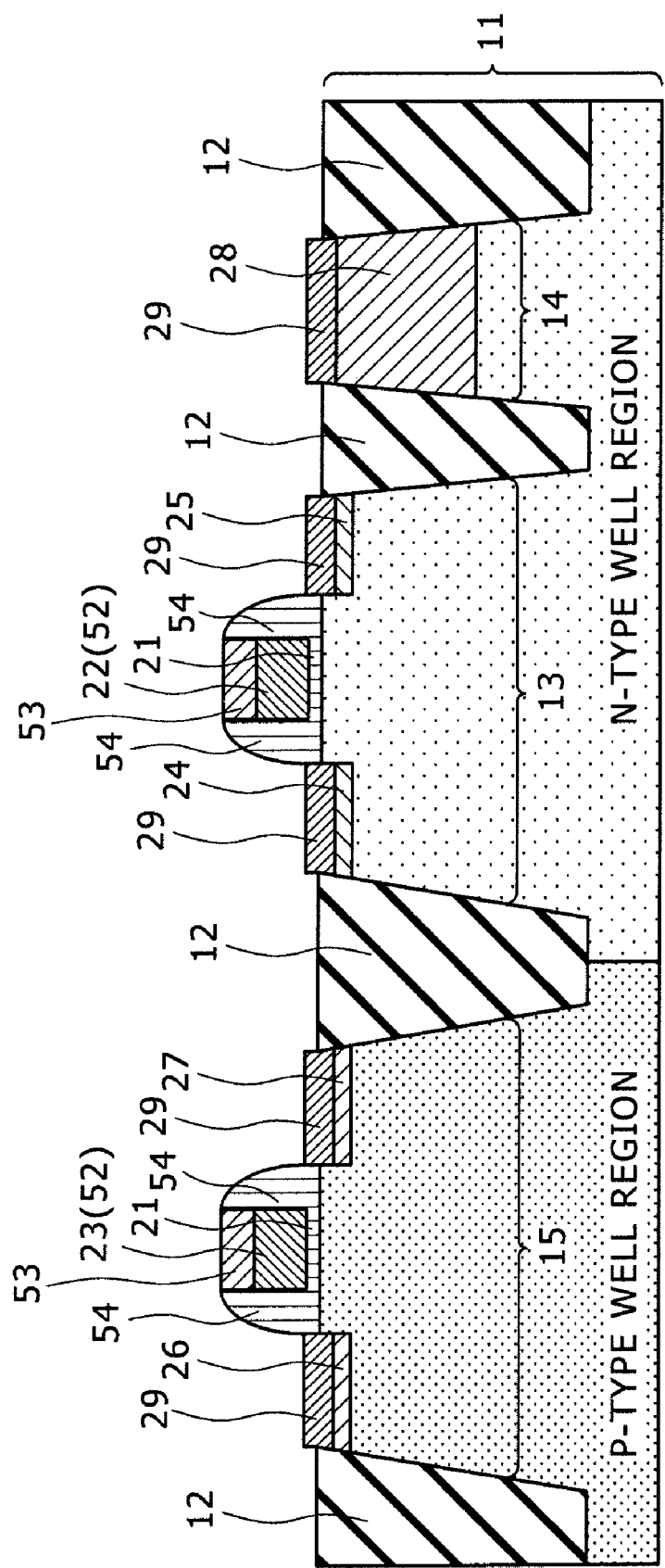
FIG. 9 is a schematic structural sectional view showing the method for manufacturing a semiconductor device according to one embodiment of the present invention.

As shown in FIGS. 8 and 9, by a general element isolation technique, an element isolation region 12 for isolating a first element formation region 13, an N-type substrate region 14, a second element formation region 15, and a P-type substrate region (not shown) from each other is formed in a semiconductor substrate 11. This element isolation region 12 can be formed based on e.g. a shallow trench isolation (STI) structure. The first element formation region 13 and the N-type substrate region 14 are formed in e.g. an N-type well region formed in the semiconductor substrate 11. The second element formation region 15 is formed in e.g. a P-type well region formed in the semiconductor substrate 11.

Subsequently, a gate insulating film 21 is formed on the semiconductor substrate 11, and an electrode forming film 52 for forming gate electrodes and a hard mask layer 53 are formed. Furthermore, a resist mask (not shown) for forming the gate electrodes is formed by a general resist application and lithography technique, and then the hard mask layer 53 and the electrode forming film 52 are etched with use of this resist mask as the etching mask, to thereby form gate electrodes 22 and 23 on which the hard mask layer 53 is disposed. Thereafter, although not shown in the drawing, extension regions of the source and drain are formed in the first element formation region 13, and extension regions of the source and drain are formed in the second element formation region 15. In the formation of the extension regions in the first element formation region 13, the second element formation region 15 is covered by a resist mask (not shown). In the formation of the extension regions in the second element formation region 15, the first element formation region 13 is covered by a resist mask (not shown). Spacers are often formed on the side surfaces of the gate electrodes before the formation of the extension regions.

Subsequently, by a sidewall forming technique, sidewalls 54 are formed on the side surfaces of the respective gate electrodes 22 and 23. By using the sidewalls 54 and the hard mask layer 53 as a mask, source and drain regions 24 and 25 are formed in the first element formation region 13, and source and drain regions 26 and 27 are formed in the second element formation region 15. In the formation of the source and drain regions 24 and 25 in the first element formation region 13, the second element formation region 15 is covered by a resist mask (not shown). In the formation of the source and drain regions 26 and 27 in the second element formation region 15, the first element formation region 13 is covered by a resist mask (not shown).

Arsenic is ion-implanted into the partial portion of the N-type substrate region 14 in the semiconductor substrate 11 to thereby form an N-type layer 28. In the formation of the source and drain regions 26 and 27, a P-type layer is formed in the partial portion of the P-type substrate region (not shown) in the semiconductor substrate 11.

Subsequently, a nickel silicide layer 29 is formed on the source and drain regions 24 to 27, the N-type substrate region 14, and the P-type substrate region (not shown). In this way, a P-type field effect transistor 2 is formed in the first element formation region 13 and an N-type field effect transistor 3 is formed in the second element formation region 15.

Figure 10:
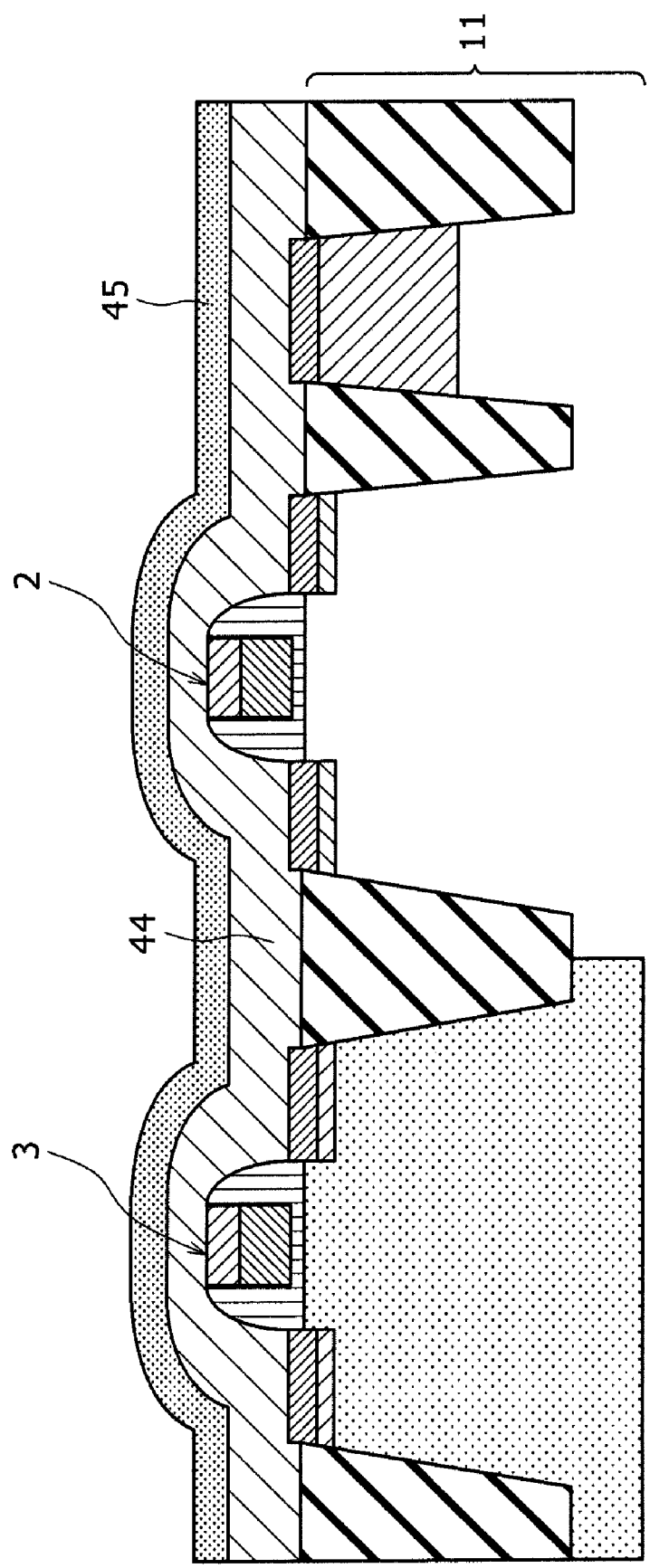
FIG. 10 is a schematic structural sectional view showing the method for manufacturing a semiconductor device according to one embodiment of the present invention.

Subsequently, as shown in FIG. 10, over the entire surface of the semiconductor substrate 11, an insulating film 44 having tensile stress is formed to cover the P-type field effect transistor 2, the N-type field effect transistor 3, and so on. This insulating film 44 is formed of e.g. a silicon nitride film having tensile stress and has a thickness in the range of e.g. 30 nm to 150 nm. A hard mask layer 45 is formed on the insulating film 44. This hard mask 45 is formed of e.g. a silicon oxide film with etching selectivity with respect to the insulating film 44 having tensile stress.

Figure 11:
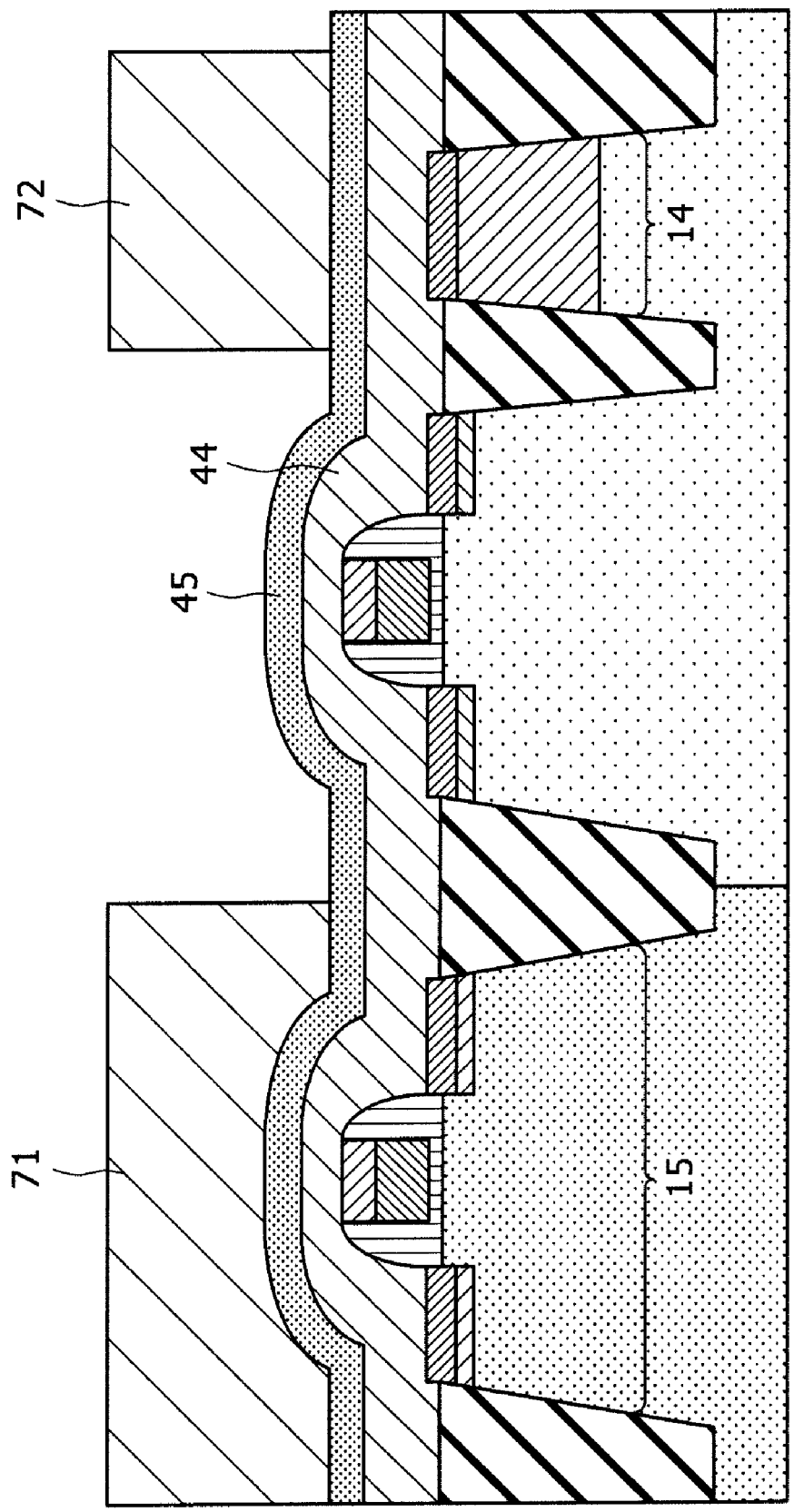
FIG. 11 is a schematic structural sectional view showing the method for manufacturing a semiconductor device according to one embodiment of the present invention.

Subsequently, as shown in FIG. 11, resist masks 71 and 72 are formed over the areas in which the insulating film 44 is to be left, i.e., on the partial portions of the hard mask layer 45 over the N-type substrate region 14 and the second element formation region 15. These resist masks 71 and 72 are formed by a general resist application and lithography technique.

Figure 12:
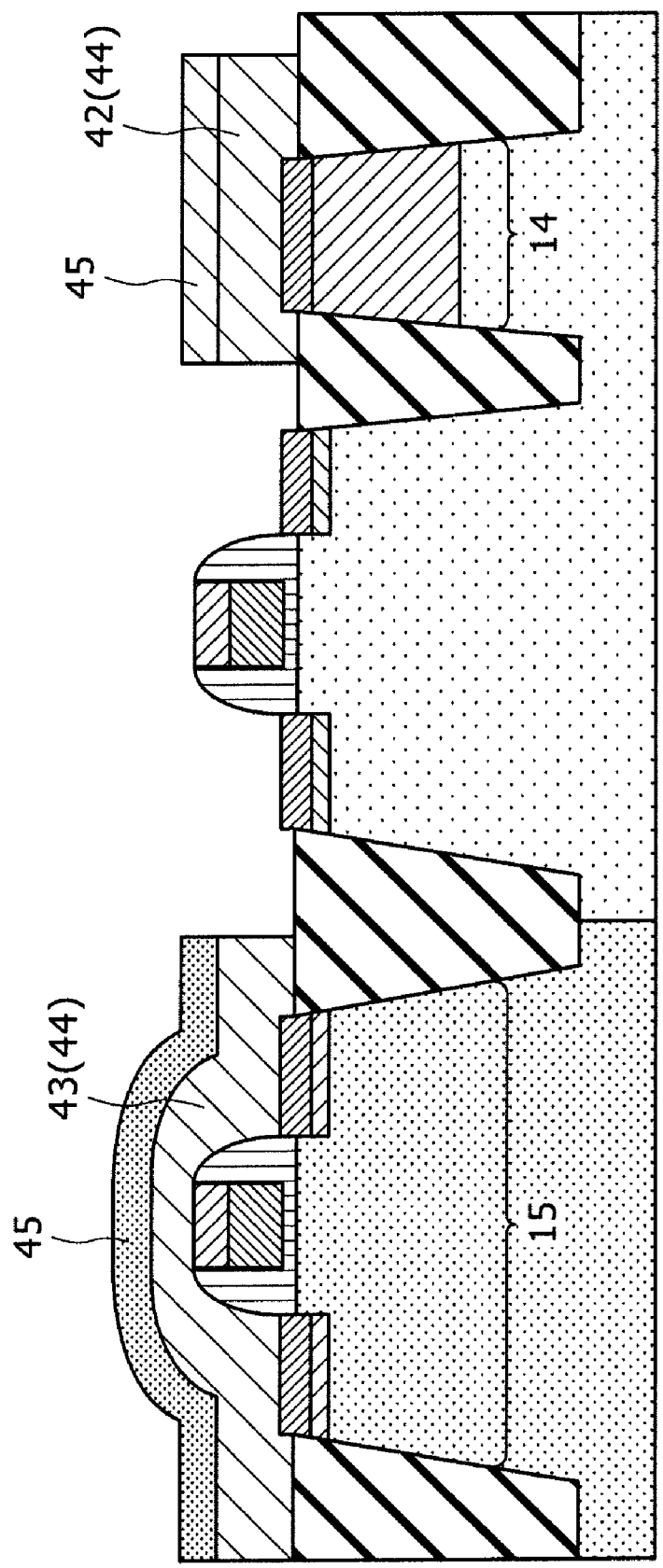
FIG. 12 is a schematic structural sectional view showing the method for manufacturing a semiconductor device according to one embodiment of the present invention.

Subsequently, as shown in FIG. 12, the hard mask layer 45 and the insulating film 44 having tensile stress are etched by using the resist masks 71 and 72 (see FIG. 11) as the etching mask. As a result, a second insulating film 42 is formed by the insulating film 44 that is left over the N-type substrate region 14 and has tensile stress, and a third insulating film 43 is formed by the insulating film 44 that is left over the second element formation region 15 and has tensile stress. After the etching, the resist masks 71 and 72 are removed. FIG. 12 shows the state after the resist masks 71 and 72 are removed.

Figure 13:
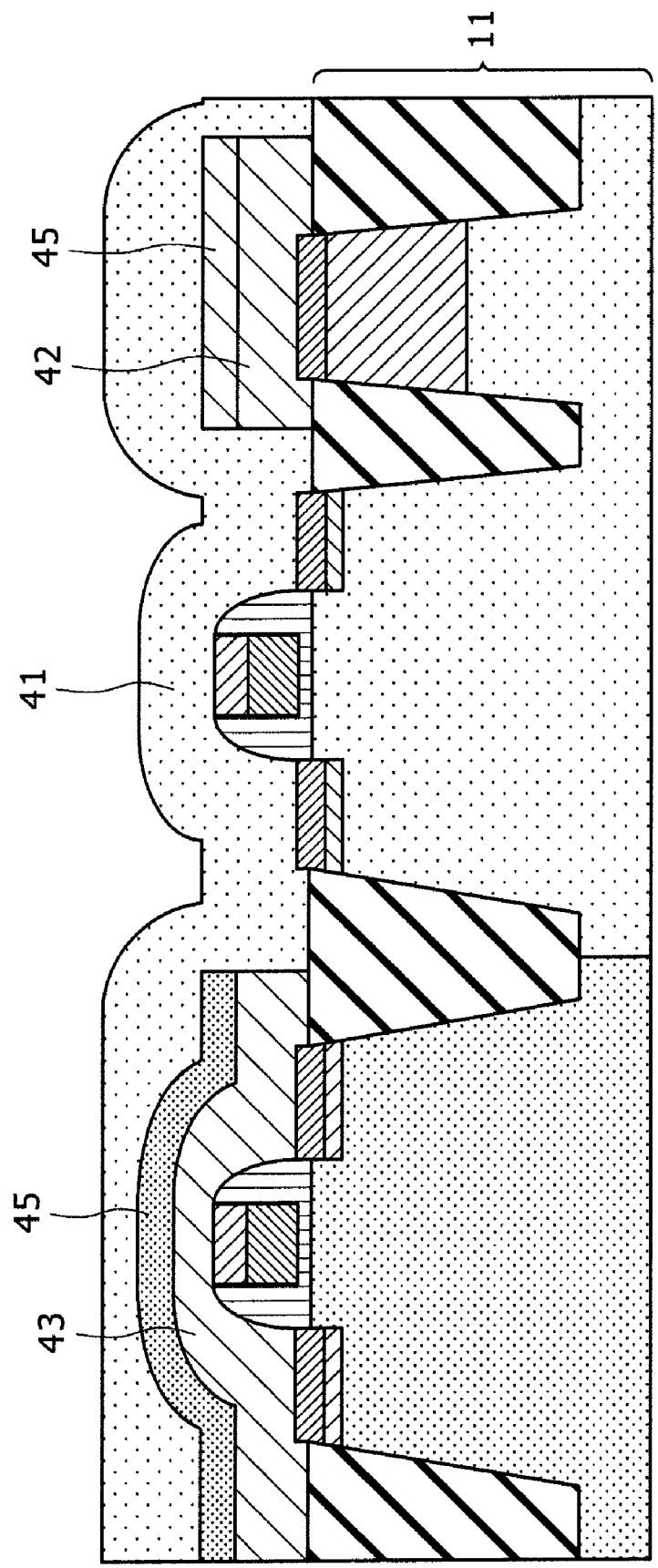
FIG. 13 is a schematic structural sectional view showing the method for manufacturing a semiconductor device according to one embodiment of the present invention.

Subsequently, as shown in FIG. 13, over the entire surface of the semiconductor substrate 11, a first insulating film 41 having compressive stress is formed to cover the second insulating film 42 and the third insulating film 43 on which the hard mask layer 45 is disposed, and so on. This first insulating film 41 is formed of e.g. a silicon nitride film having compressive stress and has a thickness in the range of e.g. 30 nm to 150 nm.

Figure 14:
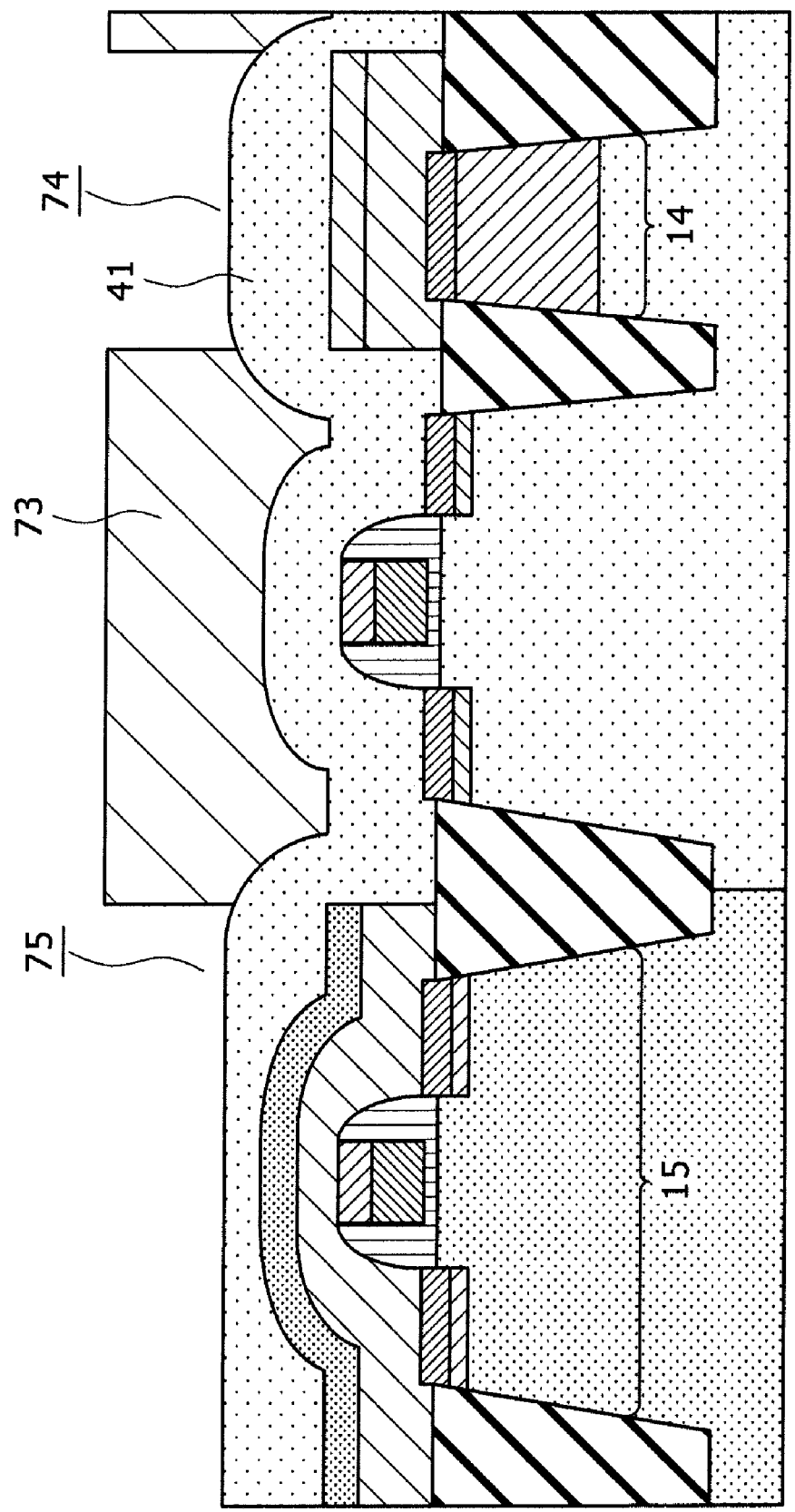
FIG. 14 is a schematic structural sectional view showing the method for manufacturing a semiconductor device according to one embodiment of the present invention.

Subsequently, as shown in FIG. 14, a resist mask 73 is formed in which apertures 74 and 75 are formed over the areas from which the first insulating film 41 is to be removed, i.e., over the N-type substrate region 14 and the second element formation region 15. This resist mask 73 is formed by a general resist application and lithography technique.

Figure 15:
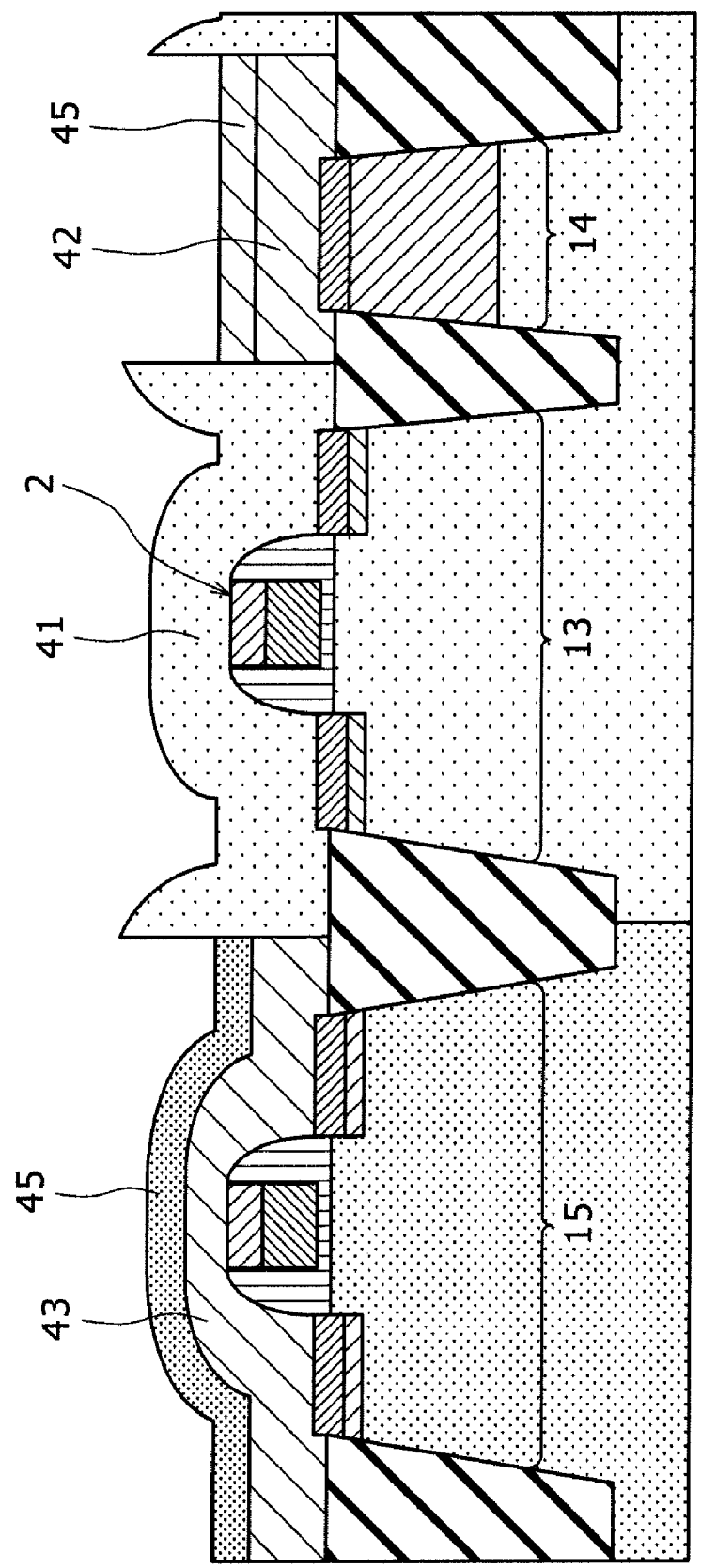
FIG. 15 is a schematic structural sectional view showing the method for manufacturing a semiconductor device according to one embodiment of the present invention.

Subsequently, as shown in FIG. 15, the first insulating film 41 is etched by using the resist mask 73 (see FIG. 14) as the etching mask. As a result, the first insulating film 41 over the N-type substrate region 14 and the second element formation region 15 is removed, and the first insulating film 41 is so formed as to cover the first element formation region 13, i.e., cover the P-type field effect transistor 2. After the etching, the resist mask 73 is removed. FIG. 15 shows the state after the resist mask 73 is removed. It is preferable that, around the connection part of the first insulating film 41 with the hard mask layer 45 on the second insulating film 42 and the hard mask layer 45 on the third insulating film 43, the first insulating film 41 be so formed as to be flush with the hard mask layer 45 or be in a state close to the flush state.

Figure 16:
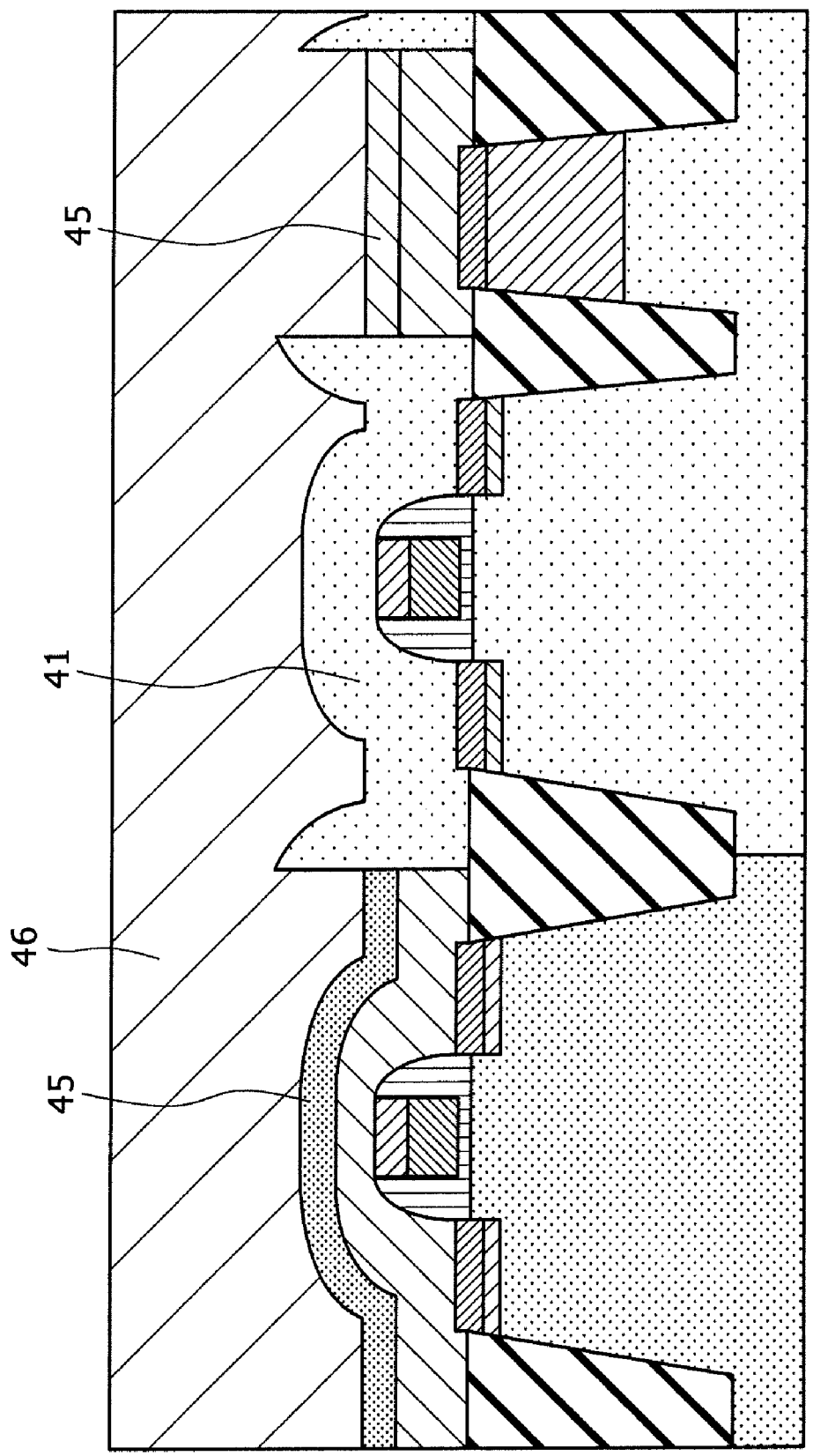
FIG. 16 is a schematic structural sectional view showing the method for manufacturing a semiconductor device according to one embodiment of the present invention.

Subsequently, as shown in FIG. 16, an interlayer insulating film 46 is formed on the hard mask layer 45 and the first insulating film 41. This interlayer insulating film 46 is formed of e.g. a silicon oxide film. Alternatively, it is also possible that the interlayer insulating film 46 be formed of a low-dielectric-constant insulating film composed of an inorganic material or a low-dielectric-constant insulating film composed of an organic material.

In the above-described manufacturing method, the second insulating film 42 and the third insulating film 43 are formed first, and then the first insulating film 41 is formed. Alternatively, the first insulating film 41 may be formed first, and then the second insulating film 42 and the third insulating film 43 may be formed. As the forming methods for the first, second, and third insulating films 41, 42, and 43 in this case, the same methods as the above-described forming methods for the first, second, and third insulating films 41, 42, and 43 can be employed. Furthermore, as the material of the first insulating film 41, the same material as that of the first insulating film 41 described for the respective embodiments of the semiconductor devices can be used. As the material of the second and third insulating films 42 and 43, the same material as that of the second insulating film 42 described for the respective embodiments of the semiconductor devices can be used.

Figure 17:
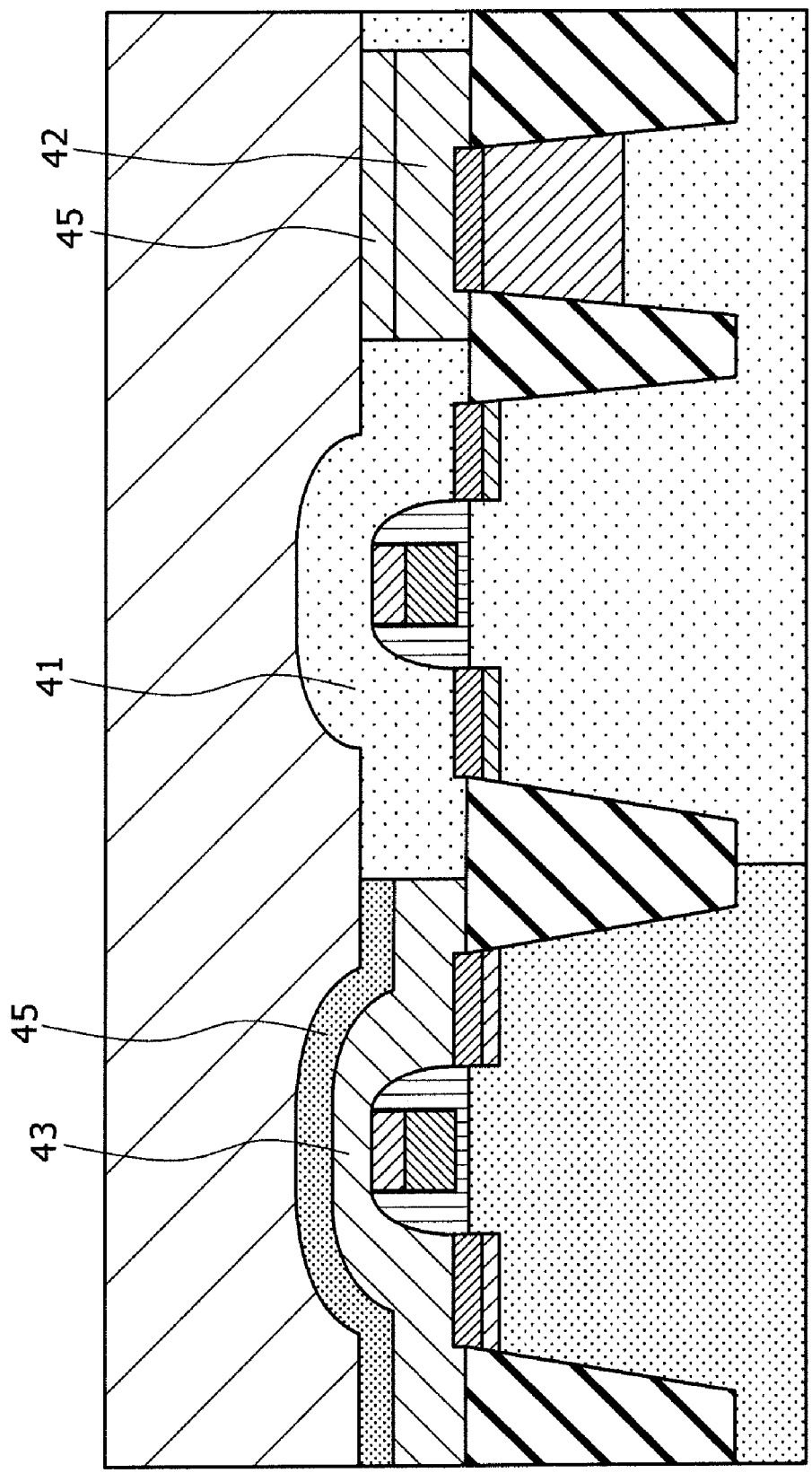
FIG. 17 is a schematic structural sectional view showing the method for manufacturing a semiconductor device according to one embodiment of the present invention.
Figure 18:
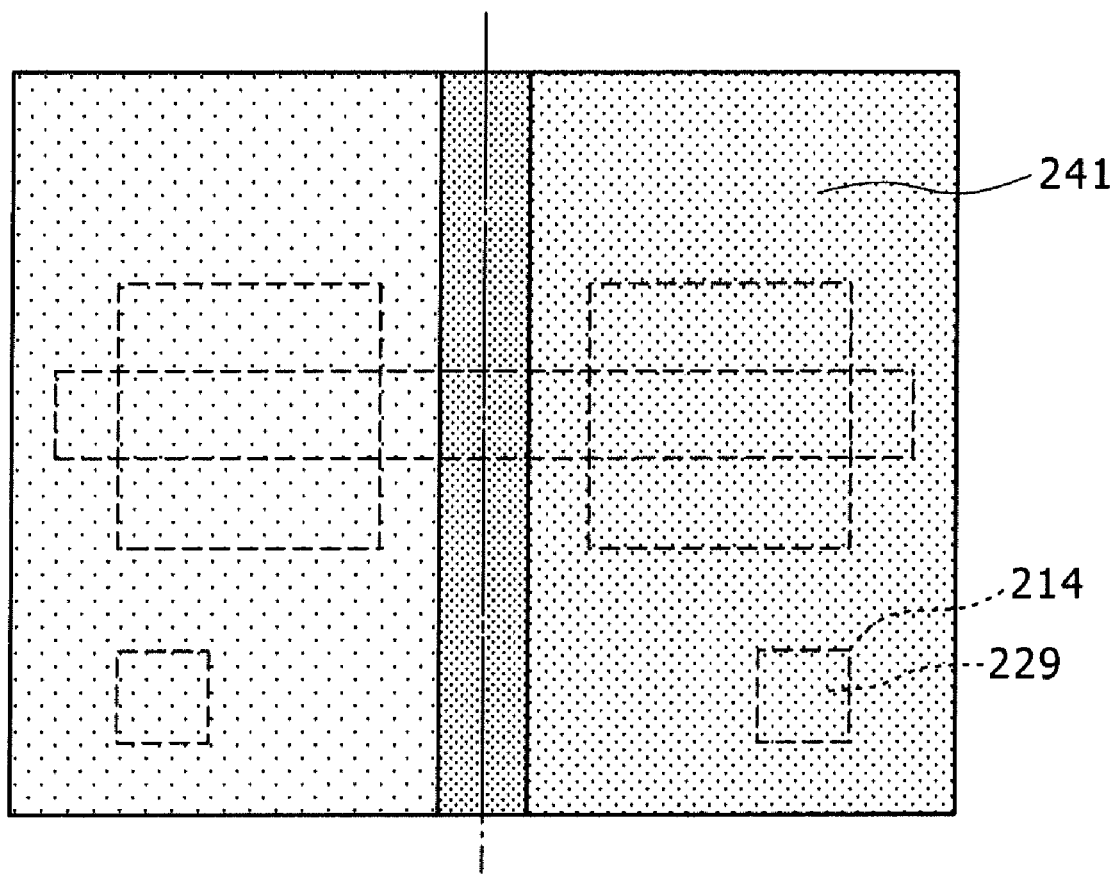
FIG. 18 is a layout plan view for explaining a problem of a related art.
Figure 19A:
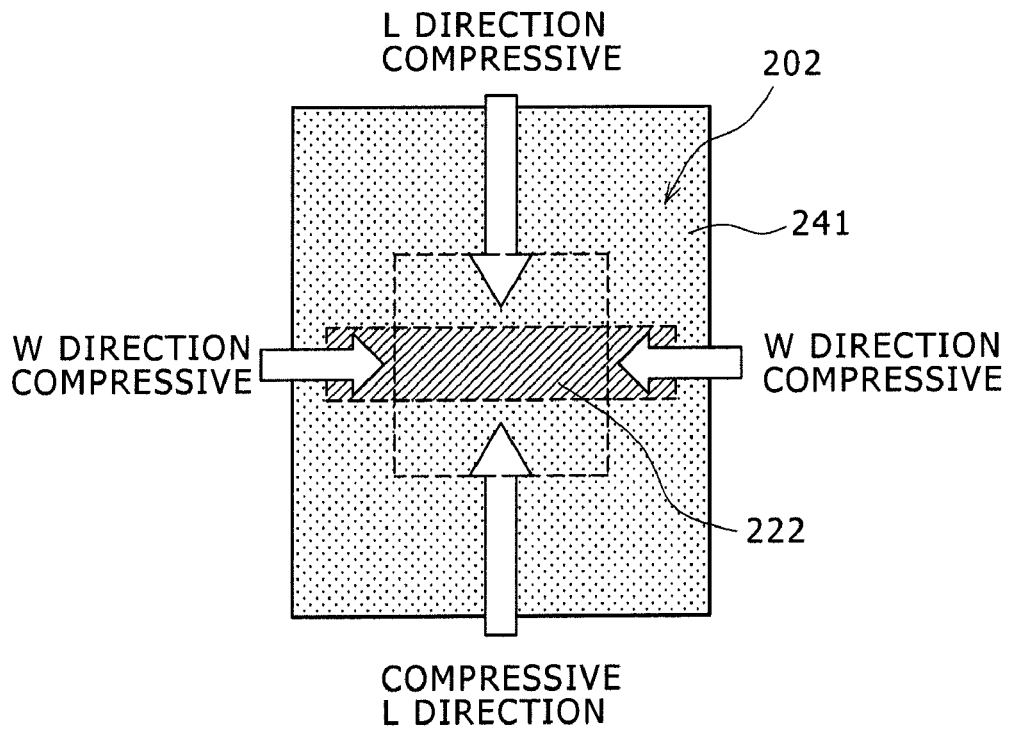
FIGS. 19A and 19B are layout plan views for explaining a problem of the related art and an ideal state.
Figure 19B:
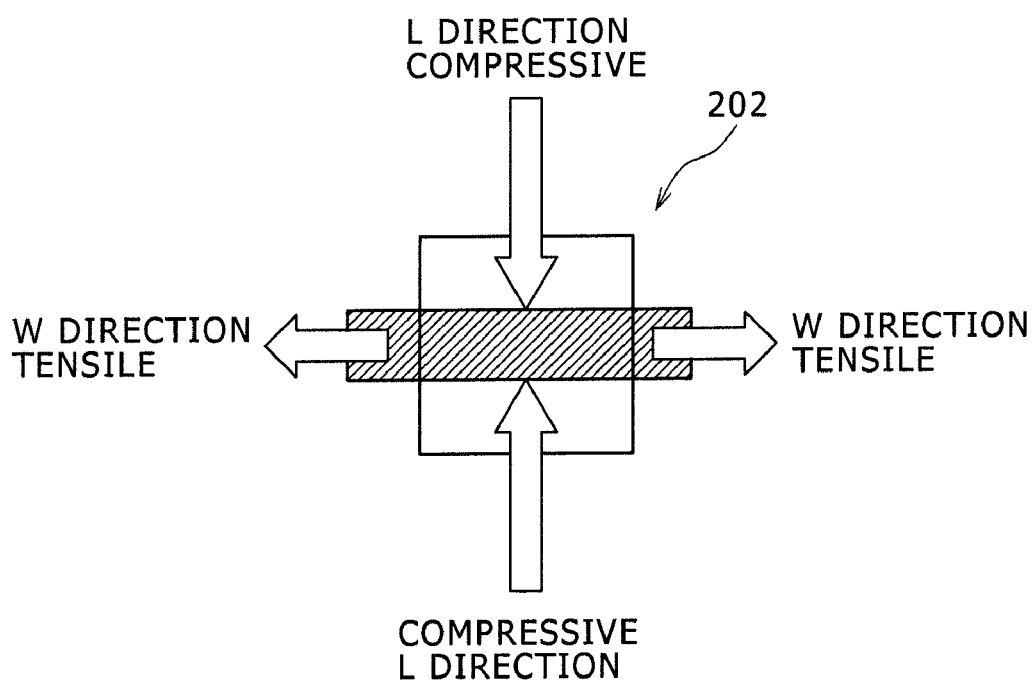

For example, by forming the first insulating film 41 as a high-density film first and then forming the second and third insulating films 42 and 43 as low-density films, the structure shown in FIG. 17 can be obtained through removal of bumps formed around the connection parts between the second and third insulating films 42 and 43 and the first insulating film 41 by etching, polishing, or another method. Specifically, the structure can be obtained in which the upper surface of the first insulating film 41, the upper surface of the hard mask layer 45 on the second insulating film 42, and the upper surface of the hard mask layer 45 on the third insulating film 43 are flush with each other or in a state close to the flush state around the respective connecting parts.

By the above-described manufacturing method, the semiconductor device having the P-type field effect transistor 2, the N-type field effect transistor 3, and the N-type substrate region 14 is manufactured. However, the manufacturing method according to the embodiment of the present invention can be applied also to a method for manufacturing a semiconductor device that has plural P-type field effect transistors 2, plural N-type field effect transistors 3, plural N-type substrate regions 14, and plural P-type substrate regions (not shown). In this case, the plural same components are simultaneously formed. Furthermore, as described for the third embodiment of the semiconductor device, it is also possible that the gate electrodes of the P-type field effect transistors 2 are formed continuously with the gate electrodes of the N-type field effect transistors 3.

In the above-described manufacturing method, the N-type substrate region 14 is covered by the second insulating film 42 having tensile stress or compressive stress lower than that of the first insulating film 41 covering the P-type field effect transistor 2. Therefore, although the density of the first insulating film 41 is high, the density of the second insulating film 42 is lower than that of the first insulating film 41. In particular, the density of the second insulating film 42 having tensile stress is low. Therefore, even when an abnormal film (e.g. a film containing oxygen) is formed on the nickel silicide layer 29 formed on the N-type substrate region 14 in which arsenic is ion-implanted to a deep position and water is absorbed by this abnormal film, the absorbed water will be discharged to the external via the second insulating film 42. This allows prevention of separation of the second insulating film 42. Thus, the problem of film separation can be solved.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    an N-type well region and a P-type well region formed in a semiconductor substrate;
    an element isolation region formed in the semiconductor substrate;
    a P-type field effect transistor formed in a first element formation region in the N-type well region of the semiconductor substrate for which isolation by the element isolation region is carried out;
    an N-type substrate region formed in the N-type well region of the semiconductor substrate for which isolation by the element isolation region is carried out, arsenic being ion-implanted into the N-type substrate region;
    a nickel silicide layer formed on the N-type substrate region;
    a first insulating film covering the P-type field effect transistor and have compressive stress; and
    a second insulating film covering the N-type substrate region and have tensile stress or compressive stress lower than the compressive stress of the first insulating film.

2. The semiconductor device according to claim 1, wherein the second insulating film having tensile stress is so formed as to overlap with an end of a gate electrode of the P-type field effect transistor over the element isolation region.

3. The semiconductor device according to claim 1, further comprising:
    an N-type field effect transistor formed in a second element formation region of the semiconductor substrate for which isolation by the element isolation region is carried out, and have a gate electrode formed continuously with a gate electrode of the P-type field effect transistor;

a P-type substrate region formed in the semiconductor substrate for which isolation by the element isolation region is carried out; and a third insulating film covering the N-type field effect transistor and have tensile stress.

4. The semiconductor device according to claim 1, wherein the second insulating film having tensile stress is formed in proximity to the first element formation region on an end side of a gate electrode of the P-type field effect transistor.

5. The semiconductor device according to claim 3, wherein the P-type field effect transistor and the N-type field effect transistor whose gate electrodes are formed continuously with each other are formed in parallel to the semiconductor substrate, the N-type substrate region into which arsenic is ion-implanted is provided in the semiconductor substrate on an opposite side to the N-type field effect transistor across the P-type field effect transistor, and the nickel silicide layer is formed on the N-type substrate region, the P-type substrate region is provided in the semiconductor substrate on an opposite side to the P-type field effect transistor across the N-type field effect transistor, the P-type field effect transistor is covered by the first insulating film having compressive stress, the N-type substrate region is covered by the second insulating film having tensile stress or compressive stress lower than the compressive stress of the first insulating film, and the N-type field effect transistor and the P-type substrate region are covered by the third insulating film having tensile stress.

6. The semiconductor device according to claim 5, wherein the second insulating film is formed in proximity to the first element formation region in which the P-type field effect transistor is formed.

7. The semiconductor device according to claim 5, wherein the third insulating film is formed in proximity to the first element formation region in which the P-type field effect transistor is formed.

8. The semiconductor device according to claim 5, wherein the tensile stress is directed in an outward direction.

* * * * *